(12) United States Patent
Chiu et al.

(10) Patent No.: US 8,158,027 B2
(45) Date of Patent: Apr. 17, 2012

(54) RED LIGHT FLUORESCENT MATERIAL AND MANUFACTURING METHOD THEREOF, AND WHITE LIGHT LUMINESCENT DEVICE

(75) Inventors: Chuang-Hung Chiu, Hsinchu County (TW); Teng-Ming Chen, Hsinchu (TW); Chi-Neng Mo, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 352 days.

(21) Appl. No.: 12/477,897

(22) Filed: Jun. 3, 2009

(65) Prior Publication Data

US 2010/0252847 A1    Oct. 7, 2010

(30) Foreign Application Priority Data

Apr. 1, 2009    (TW) ................. 98110900 A (51) Int. Cl.
| C09K 11/08 | (2006.01) |
| C09K 11/70 | (2006.01) |
| C09K 11/54 | (2006.01) |

(52) U.S. Cl. ............................ 252/301.4 P; 252/301.6 P
(58) Field of Classification Search ............ 252/301.4 P, 252/301.6 P
See application file for complete search history.

(56) References Cited

U.S. PATENT DOCUMENTS 5,998,925 A    12/1999    Shimizu et al.

FOREIGN PATENT DOCUMENTS

| CN | 101343541 | 1/2009 |
| WO | 02-11173 | 2/2002 |

OTHER PUBLICATIONS

Synthesis and Crystal Structure of New Complex Sodium Lanthanide Phosphate Molybdates Na2MIII(MoO4))(PO4) (MIII=Tb, Dy, Ho, Er, Tm, Lu). Rusian Journal of Inorganic Chemistry 2007, vol. 52, pp. 653-660.*
"Office Action of Japan Counterpart Application", issued on Feb. 14, 2012, p.1-p.3, in which the listed reference was cited.

\* cited by examiner

*Primary Examiner* — Carol M Koslow
*Assistant Examiner* — Matthew Hoban
(74) *Attorney, Agent, or Firm* — Jianq Chyun IP Office (57) ABSTRACT

A red light fluorescent material adapted for being excited by a first light to emit a red light is provided. The red light fluorescent material has the chemical formula (1) presented below, $$A_2Eu(MoO_4)(PO_4) \qquad (1),$$

in which A represents Li, Na, K, Rb, Cs, or Ag, and M represents Mo, W, or a combination thereof ($Mo_x W_{(1-x)}$). The red light fluorescent material can provide a red light with high luminance and good color purity. Moreover, since the composition of the red light fluorescent material includes oxides, the red light fluorescent material has high chemical stability and long lifetime.

18 Claims, 5 Drawing Sheets

RED LIGHT FLUORESCENT MATERIAL AND MANUFACTURING METHOD THEREOF, AND WHITE LIGHT LUMINESCENT DEVICE

CROSS-REFERENCE TO RELATED APPLICATION

This application claims the priority benefit of Taiwan application serial no. 98110900, filed on Apr. 1, 2009. The entirety of the above-mentioned patent application is hereby incorporated by reference herein and made a part of specification.

BACKGROUND OF THE INVENTION

1. Field of the Invention

The present invention relates to a red light fluorescent material and a manufacturing method thereof, and a white light luminescent device incorporating the red light fluorescent material. More particularly, the present invention relates to a red light fluorescent material with high color purity, high luminance, and high chemical stability and a manufacturing method thereof, and a white light luminescent device incorporating this red light fluorescent material.

2. Description of Related Art

With recent progress in green technologies, a white light emitting diode now has advantages of low power consumption, compactness, low driving voltage, mercury free, and so forth. Therefore, the white light emitting diode has been extensively applied in the backlight modules of flat panel displays and illumination. In order to enhance the light emitting performance of the white light emitting diode, research and development of fluorescent materials play a significant role. Different novel fluorescent materials have been provided as a result.

In a white light luminescent device disclosed in U.S. Pat. No. 5,998,925 by the Nichia company, the white light luminescent device mainly transforms blue light emitted by a blue light emitting diode into yellow light with use of the garnet fluorescent powder doped with cerium ($Y_3Al_5O_{12}:Ce^{3+}$, YAG:Ce) so as to generate white light by mixing the blue light and the yellow light. However, the white light generated by the blue light emitting diode and the garnet fluorescent material which is doped with cerium always has the problem of high color temperature. Especially, when an operating current is elevated, the problem of the increased color temperature is further worsened. Moreover, as a white light luminescent spectrum does not include a red-colored component, the white light generated by this method has poor color rendering property, and thus has insufficient color rendering property when used as the illuminating light source. For instance, a red object irradiated by this white light has a color of pale orange.

The above problem can be resolved by increasing the red-colored component in the white light luminescent spectrum. According to the international patent application WO 02/11173 A1 published by ORSAM, a light emitting diode with a light emitting wavelength of the UV light~the blue light (370 nm~480 nm) cooperates with a dual-fluorescent powder system constituted by red light fluorescent powder and yellow-green light fluorescent powder to generate the white light. Here, the chemical formula of the red light fluorescent powder is $MS:Eu^{2+}$, where M represents Ba, Sr, Ca, Mg, or Zn. The chemical formula of the yellow-green light fluorescent powder is $M^*N^*_2S_4:Eu^{2+}, Ce^{3+}$, where M* represents Ba, Sr, Ca, Mg, or Zn while N* represents Al, Ga, In, Y, La, or Gd.

The white light generated by the aforementioned dual-fluorescent powder system helps resolve the problems of the increased color temperature and the insufficient color rendering property. However, the components of the fluorescent powder used herein all contain sulfide, which easily reacts with moisture in the air, so that the dual-fluorescent powder system has poor chemical stability. In addition, under long term irradiation of the UV light, the dual-fluorescent powder system degrades easily and has the problem of insufficient lifetime. Besides, as sulfide has poor thermal stability, the fluorescent powder that incorporates sulfide as the main component has limited applications.

SUMMARY OF THE INVENTION

Accordingly, a red light fluorescent material which provides a red light with high luminance and high color purity is provided in the present invention.

A manufacturing method of a red light fluorescent material is further provided in the present invention. By applying the manufacturing method at a low sintering temperature, a red light fluorescent material with high chemical stability can be obtained.

A white light luminescent device which includes the aforementioned red light fluorescent material is further provided in the present invention. The white light luminescent device provides a white light with good color rendering property and has a long lifetime.

In light of the foregoing, a red light fluorescent material adapted for being excited by a first light to emit a red light is provided in the present invention. The red light fluorescent material is characterized by the chemical formula (1) presented below, $$A_2Eu(MO_4)(PO_4) \qquad \text{formula (1)},$$

wherein A represents lithium (Li), sodium (Na), potassium (K), rubidium (Rb), cesium (Cs), or silver (Ag), and M represents molybdenum (Mo), tungsten (W), or a combination thereof .

According to an embodiment of the present invention, a wavelength of the first light ranges from 360 nm to 550 nm.

According to an embodiment of the present invention, a wavelength of the first light includes a near UV light wavelength of 394±10 nm, a blue light wavelength of 465±10 nm, or a yellow-green light wavelength of 535±10 nm.

According to an embodiment of the present invention, a wavelength of the red light includes 614 nm.

According to an embodiment of the present invention, when M represents a combination of molybdenum and tungsten, i.e., ($Mo_xW_{(1-x)}$), x is a mole fraction ranging from 0 to 1.

According to an embodiment of the present invention, chromaticity coordinates of the red light can be (0.66, 0.33).

According to an embodiment of the present invention, a relative luminance value of the red light is 1.5~1.9 ($cd/m^2$).

According to an embodiment of the present invention, the red light fluorescent material is adapted for a white light emitting diode.

The present invention also provides a manufacturing method of a red light fluorescent material. Firstly, a mixture including europium oxide ($Eu_2O_3$), diammonium hydrogen phosphate (($NH_4)_2HPO_4$), and metal molybdate or metal tungstate, or a combination of metal molybdate and metal tungstate is provided according to stoichiometry. Next, the mixture is mixed and ground. Thereafter, the mixture is sintered to obtain the red light fluorescent material.

According to an embodiment of the present invention, the time of mixing and grinding the mixture is 30 minutes.

According to an embodiment of the present invention, the temperature of sintering the mixture is 600° C.

According to an embodiment of the present invention, the time of sintering the mixture ranges from 6 hours to 10 hours.

According to an embodiment of the present invention, the red light fluorescent material has the chemical formula (1) presented below, $$A_2Eu(MO_4)(PO_4) \qquad \text{formula (1),}$$

wherein A represents lithium (Li), sodium (Na), potassium (K), rubidium (Rb), cesium (Cs), or silver (Ag), and M represents molybdenum (Mo), tungsten (W), or a combination thereof ($Mo_xW_{(1-x)}$).

According to an embodiment of the present invention, a characteristics identification step is further included to identify the physical and chemical characteristics of the red light fluorescent material.

According to an embodiment of the present invention, the characteristics identification step includes performing an X-ray diffraction analysis, a fluorescence spectroscopy analysis, a chromaticity coordinate analysis, or a UV light-visible light reflection spectroscopy analysis.

A white light luminescent device which includes a light emitting diode (LED) chip and a phosphor material is further provided in the present invention. The LED chip emits a first light. The phosphor material includes at least the above-mentioned red light fluorescent material. Here, the phosphor material is excited by the first light to emit a second light, and the first light and the second light are mixed to generate a white light.

According to an embodiment of the present invention, a wavelength of the first light ranges from 360 nm to 550 nm.

According to an embodiment of the present invention, a wavelength of the first light includes a near UV light wavelength of 394±10 nm, a blue light wavelength of 465±10 nm, or a yellow-green light wavelength of 535±10 nm.

According to an embodiment of the present invention, the phosphor material further includes an yellow light fluorescent material, a blue light fluorescent material, or a green light fluorescent material. The red light fluorescent material is adapted to be cooperated with the yellow light fluorescent material, the blue light fluorescent material, and the green light fluorescent material optionally.

Since the red light fluorescent material of the present invention has a novel chemical structure, a red light with high color purity and high luminance can be provided. Especially, in the manufacturing method of the red light fluorescent material provided in the present invention, as the composition of the red light fluorescent material includes oxides instead of sulfides which have poor chemical stability, the red light fluorescent material thus has high chemical stability. Furthermore, as the temperature required for sintering is low, the energy consumption is reduced as well. In addition, since the white light luminescent device of the present invention utilizes the aforementioned red light fluorescent material, a white light with good color rendering property and long lifetime is provided.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

A novel red light fluorescent material is provided in the present invention. The red light fluorescent material has a unique chemical crystal structure that allows the production of a red light with high color purity and high luminance. Other than resolving the conventional problem of the insufficient color rendering property, the novel red light fluorescent material also excludes the sulfide structure, thereby solving the problem of poor chemical stability fundamentally. In the following, the red light fluorescent material and a manufacturing method thereof, and a white light luminescent device using this red light fluorescent material are described accordingly.

Red Light Fluorescent Material

A red light fluorescent material provided in the present invention is adapted for being excited by a first light to emit a red light. The red light fluorescent material is characterized by a chemical formula (1) which is presented below, $$A_2Eu(MO_4)(PO_4) \qquad \text{formula (1).}$$

Here, A represents lithium (Li), sodium (Na), potassium (K), rubidium (Rb), cesium (Cs), or silver (Ag), and M represents molybdenum (Mo), tungsten (W), or a combination thereof ($Mo_xW_{(1-x)}$).

It needs to be illustrated that when M in the formula (1) represents the combination of Mo and W ($Mo_xW_{(1-x)}$), x is a mole fraction ranging from 0 to 1. Moreover, a wavelength of the first light ranges from 360 nm to 550 nm. That is, the red light fluorescent material is adapted to be excited by the first light with the wavelength of UV light to blue light and yellow-green light so as to emit the red light.

Figure 2:
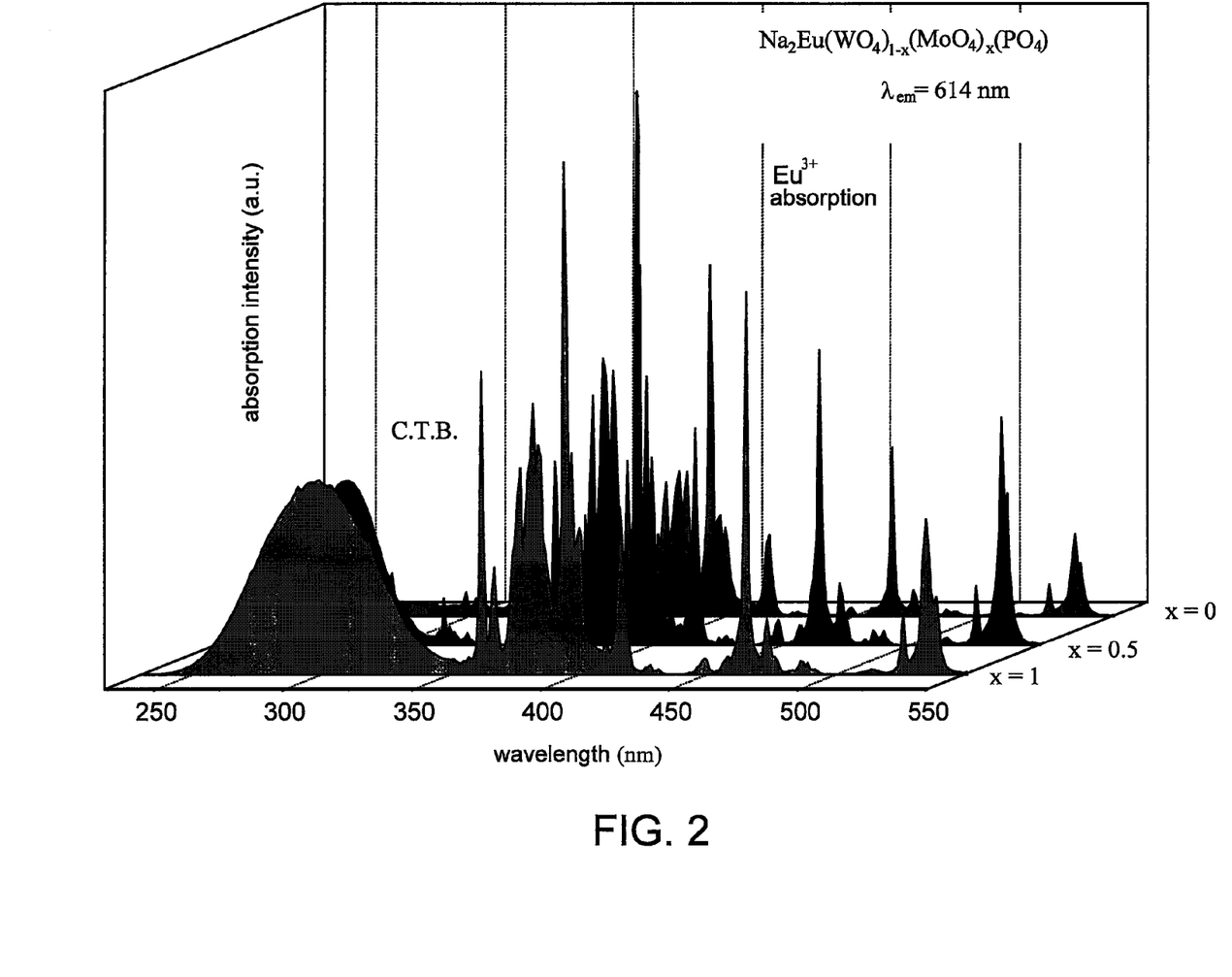
FIG. 2 is an excited spectrum of the red light fluorescent material according to an embodiment of the present invention.

More particularly, a red light fluorescent material has the chemical structure represented by the formula (1) which can well absorb lights with specific wavelengths, preferably a near UV light wavelength of 394±10 nm, a blue light wavelength of 465±10 nm, or an yellow-green light wavelength of 535±10 nm. After absorbing the light energy of the specific wavelength, the red light fluorescent material releases the energy in the form of the red light. The wavelength of the red light is 614 nm (as shown in FIG. 2 in the following), for example.

Figure 4:
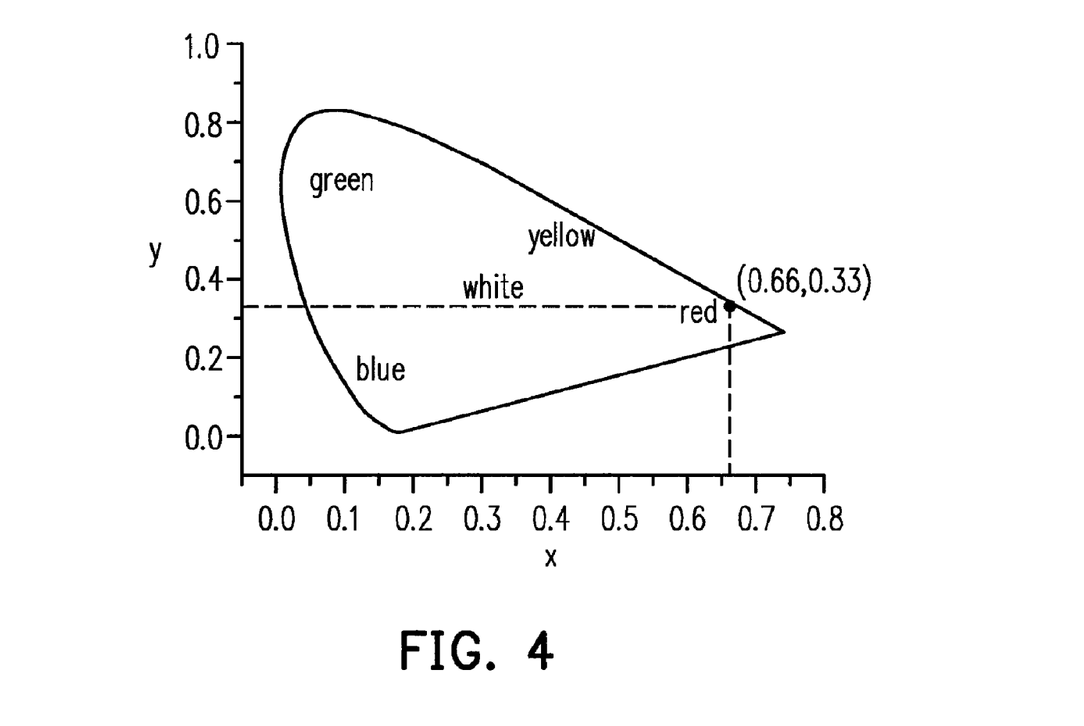
FIG. 4 is a schematic diagram of chromaticity coordinates of the red light fluorescent material according to an embodiment of the present invention.

Moreover, the red light emitted by the red light fluorescent material has color purity at the location (0.66, 0.33) of the NTSC chromatic coordinates. In other words, the color purity of the red light approaches saturated red (as shown in FIG. 4 in the following). Besides, the relative luminance value of the red light fluorescent material further reaches 1.5~1.9 (cd/m²) (as shown in Table 1 in the following).

Furthermore, as the red light fluorescent material provides the red light with high luminance and high color purity, this red light fluorescent material is adapted to be applied in a white LED.

Manufacturing Method of Red Light Fluorescent Material

Figure 1:
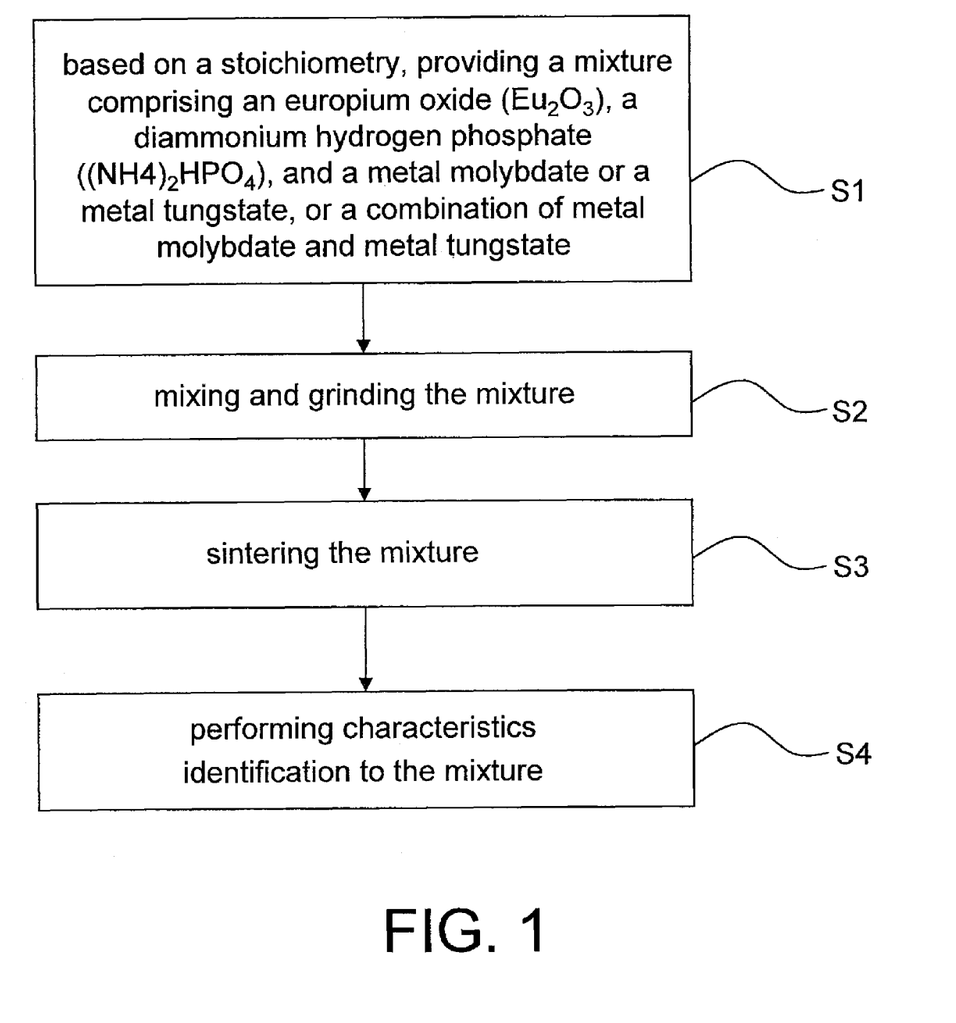
FIG. 1 is a schematic flow chart of a manufacturing method of a red light fluorescent material according to an embodiment of the present invention.

FIG. 1 is a flow chart of a manufacturing method of a red light fluorescent material according to an embodiment of the present invention. First, referring to FIG. 1, in step S1, a mixture including europium oxide ($Eu_2O_3$), diammonium hydrogen phosphate (($NH_4$)$_2HPO_4$), and metal molybdate or metal tungstate, or a combination of metal molybdate and metal tungstate is provided according to stoichiometry.

More specifically, in a manufacturing method of the red light fluorescent material, the composition ratio of each component of the red light fluorescent material is adjusted according to the mole fraction as shown in the formula (1). Herein, metal molybdate is sodium molybdate ($Na_2MoO_4$), and metal tungstate is sodium tungstate ($Na_2WO_4$), for example.

Next, in step S2, the mixture is mixed and ground. In step S2, in order to obtain a more uniform mixture, the mixing and grinding of the mixture requires about 30 minutes.

Thereafter, as illustrated in step S3, the mixed and ground mixture is sintered to form the red light fluorescent material. When performing the sintering in step S3, the uniformly mixed and ground mixture is placed in an aluminum oxide crucible, for instance. The aluminum oxide crucible is then placed in a high temperature furnace to perform sintering for about 6~10 hours at 600° C. to obtain the red light fluorescent material.

The red light fluorescent material obtained by performing the aforesaid steps is in an oxide state and can be represented by a chemical formula (1) $A_2Eu(MO_4)(PO_4)$. Here, A represents lithium (Li), sodium (Na), potassium (K), rubidium (Rb), cesium (Cs), or silver (Ag), and M represents molybdenum (Mo), tungsten (W), or a combination thereof ($Mo_xW_{(1-x)}$).

Referring to FIG. 1 continuously, as illustrated in step S4, a characteristics identification step S4 can be further performed to the red light fluorescent material manufactured by implementing the steps S1~S3 to identify the physical and chemical characteristics of the red light fluorescent material. In details, the characteristics identification step includes performing an X-ray diffraction analysis, a fluorescence spectroscopy analysis, a chromaticity coordinate analysis, or a UV light-visible light reflection spectroscopy analysis. However, the present invention is not limited thereto.

It should be noted that in the manufacturing method of the red light fluorescent material as provided in the present invention, the main components used are basic metal molybdate, basic metal tungstate, $Eu_2O_3$, and ($NH_4$)$_2HPO_4$. Moreover, the sintering temperature required is only about 600° C. Compared the conventional garnet fluorescent material doped with cerium (with a sintering temperature of 1,500° C.), the conventional silicate and germanate fluorescent material (with a sintering temperature of 1,000° C.~1,200° C.), and the sulfur-containing red light fluorescent material (with a sintering temperature of 1,100° C.~1,200° C.), the red light fluorescent material of the present invention is formed in the manufacturing method at a lower sintering temperature and thus can reduce the required power consumption and the necessary manufacturing cost.

Furthermore, as the composition of the red light fluorescent material of the present invention includes oxides instead of sulfides which have poor chemical stability, the red light fluorescent material has high chemical stability. Namely, the red light fluorescent material of the present invention can obtain long lifetime and extensive application under a long term irradiation of UV light or in a high temperature environment.

Figure 3:
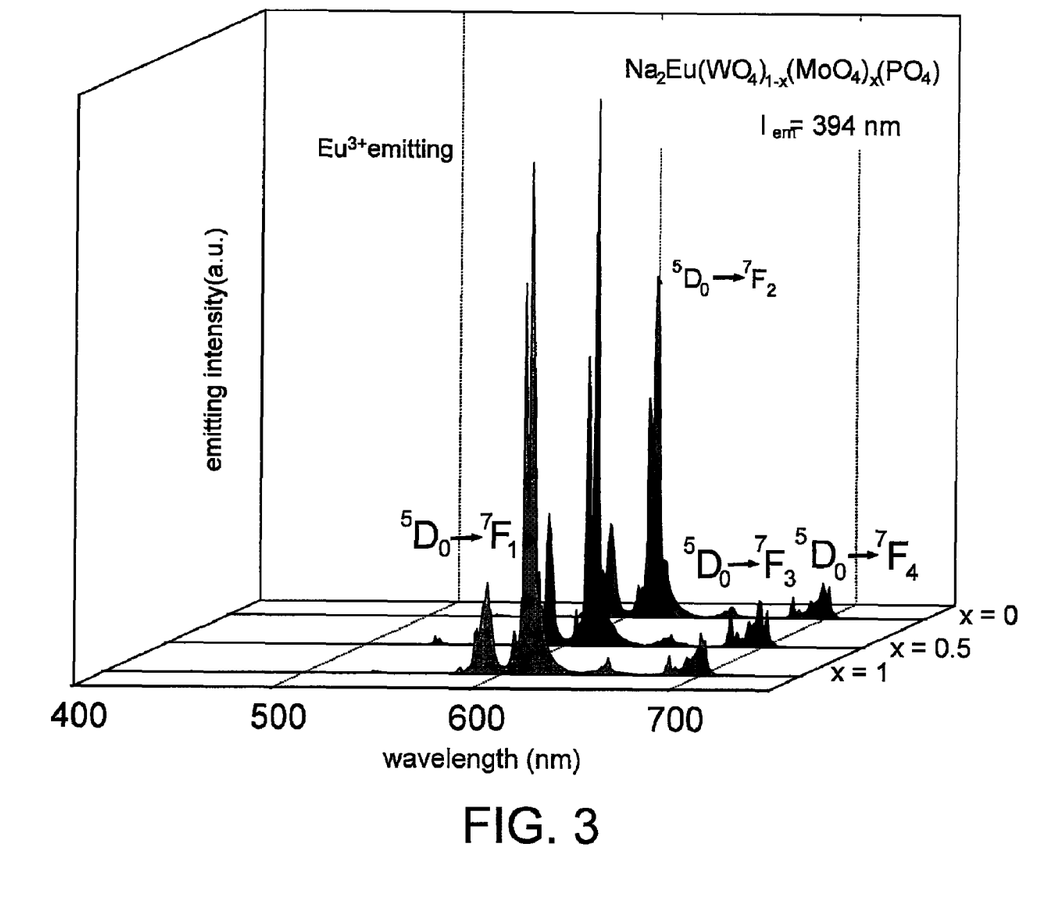
FIG. 3 is an emitting spectrum of the red light fluorescent material according to an embodiment of the present invention.
Figure 5:
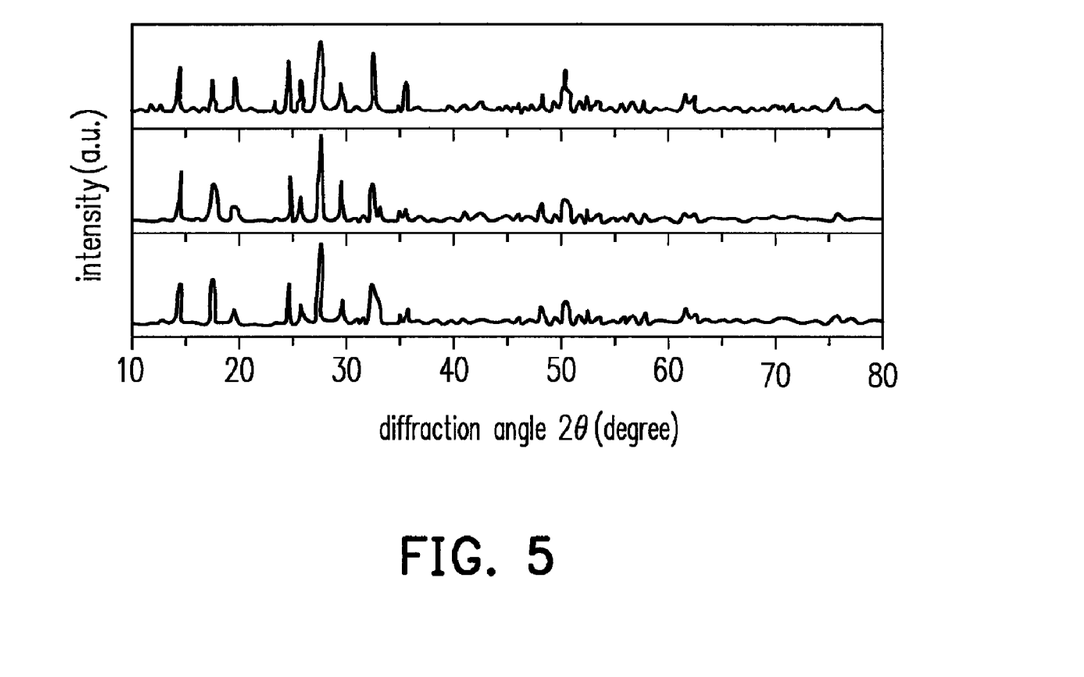
FIG. 5 is an X-ray diffraction diagram of the red light fluorescent material according to an embodiment of the present invention.

In the following, three types of red light fluorescent material manufactured according to the aforementioned embodiment are listed. Moreover, the results of the property evaluations are illustrated in FIG. 2~FIG. 5. Here, FIG. 2 is an excited spectrum of the red light fluorescent material according to an embodiment of the present invention. FIG. 3 is an emitting spectrum of the red light fluorescent material according to an embodiment of the present invention. FIG. 4 is a schematic diagram of chromaticity coordinates of the red light fluorescent material according to an embodiment of the present invention. FIG. 5 is an X-ray diffraction spectrum of the red light fluorescent material according to an embodiment of the present invention. In addition, two commercial red light fluorescent materials are exemplified for comparison, such that some of the functions and effects achieved in present invention can be clearly disclosed.

Embodiment 1

As illustrated in FIG. 1, a mixture is formed by mixing $Na_2WO_4$, $Eu_2O_3$, and ($NH_4$)$_2HPO_4$ according to stoichiometry. Next, the mixture is disposed on an aluminum oxide crucible after 30 minutes of grinding. Afterwards, the crucible is placed in a high temperature furnace and sintered for 8 hours at 600° C. to obtain a red light fluorescent material $Na_2Eu(WO_4)(PO_4)$.

Thereafter, the UV light-visible light reflection spectroscopy analysis, the fluorescence spectroscopy analysis, the chromaticity coordinate analysis, and the X-ray diffraction analysis are performed on $Na_2Eu(WO_4)(PO_4)$. The result of the fluorescence excited spectroscopy analysis is shown in FIG. 2. The result of the fluorescence emitting spectroscopy analysis is illustrated in FIG. 3. The result of the chromaticity coordinate analysis is illustrated in FIG. 4. The result of the X-ray diffraction analysis is shown in FIG. 5.

More specifically, according to the fluorescence spectroscopy analysis, a first light of different wavelengths can be provided via the Spex Fluorolog-3spectrofluorometer (Instruments S.A., Edison, N.J., U.S.A.). The wavelength of the first light ranges from 360 nm~550 nm. After the first light generated by the Spex Fluorolog-3spectrofluorometer passes through the red light fluorescent material to be measured, the photomultiplier (Hamamatsu Photonics R928) is utilized to measure the intensity of the absorbed first light or the intensity of a second light, wherein the second light is emitted by the red light fluorescent material. The measurement of the chromatic coordinates is conducted by utilizing the CIE1931 coordinate system. In the present embodiment, the chromatic coordinates are measured by means of a color analyzer (Laiko Dt-100).

Referring to FIG. 2, the absorption spectrum of the red light fluorescent material $Na_2Eu(WO_4)(PO_4)$ in the embodiment 1 shows the peak absorption at x=0. Here, the absorption spectrum of the embodiment 1 has obvious absorption intensities at the near UV light wavelength of 394±10 nm, the blue light wavelength of 46510 nm, and the yellow-green light wavelength of 535±10 nm. More specifically, the absorption intensity is the highest at the near UV light wavelength of 394 nm. In addition, the peak absorption at the wavelength of 250 nm~350 nm is mainly caused by a charge transfer band (C.T.B.).

Next, referring to FIG. 3, the emitting spectrum of the red light fluorescent material $Na_2Eu(WO_4)(PO_4)$ of the embodiment 1 shows the peak absorption at x=0. When the light of the near UV light wavelength of 394 nm is applied to the red light fluorescent material of the embodiment 1, and the emitting spectrum is measured, a plurality of linear emitting regions ($^5D_0 \rightarrow {}^7F_j$, J=1, 2, 3, 4) is included at the wavelength of 580 nm~720 nm. Especially, the emitted light with the highest intensity is generated in the linear emitting region at the wavelength of 614 nm.

It should be described that the four linear emitting regions belong to the characteristic spectrum ($^5D_0 \rightarrow {}^7F_j$, J=1, 2, 3, 4) of $Eu^{3+}$ returning to a ground state from an excited state. In the characteristic spectrums in the embodiments 1~3, the two linear emitting regions with more apparent intensities are $^5D_0 \rightarrow {}^7F_1$ and $^5D_0 \rightarrow {}^7F_2$. The intensity of the linear emitting region $^5D_0 \rightarrow {}^7F_1$ located at the wavelength of 590 nm is related to the magnetic dipole property. The intensity of the linear emitting region $^5D_0 \rightarrow {}^7F_2$ which is located at the wavelength of 614 nm is related to the electric dipole transition.

Since $Eu^{3+}$ ions occupy the non-centrosymmetric positions of the crystal lattice in the red light fluorescent material of the present invention, 4f→4f electric dipole transition is more likely to occur. Therefore, the emitting intensity of the electric dipole increases. By contrast, the emitting intensity of the magnetic dipole decreases. In summary, in the red light fluorescent material of the embodiment 1, the main peak absorption is observed to be the emission of the highly saturated red light $^5D_0 \rightarrow {}^7F_2$ transition.

Further, referring to FIG. 4, the chromatic coordinates of the red light fluorescent material is at (0.66, 0.33) on the NTSC chromatic coordinate. That is, the color purity of the red light approaches saturated red.

In addition, referring to FIG. 5, the X-ray diffraction analysis of the red light fluorescent material $Na_2Eu(WO_4)(PO_4)$ in the embodiment 1 shows the peak absorption at x=0. Through the X-ray diffraction analysis, the lattice structure of the red light fluorescent material can be understood.

Embodiment 2

Similar to the embodiment 1, embodiment 2 discloses a manufacturing method as illustrated in FIG. 1. According to the manufacturing method of the present embodiment, a mixture is formed by mixing $Na_2MoO_4$, $Na_2WO_4$, $Eu_2O_3$, and $(NH_4)_2HPO_4$ according to stoichiometry. After the mixture is ground and sintered, a red light fluorescent material $Na_2Eu(WO_4)_{0.5}(MoO_4)_{0.5}(PO_4)$ of the embodiment 2 is obtained.

Similarly, the characteristics identification is performed on the red light fluorescent material of the embodiment 2, and the results are represented in FIGS. 2~5. The absorption of the red light fluorescent material $Na_2Eu(WO_4)_{0.5}(MoO_4)_{0.5}(PO_4)$ of embodiment 2 is shown at x=0.5.

It should be noted that the embodiment 2 is characterized in that the mole fraction of metal molybdate to metal tungstate in the composition is 0.5:0.5. The spectrum properties of the red light fluorescent material in the embodiment 2 are similar to those of the red light fluorescent material in the embodiment 1 and thus are not repeated herein. The difference therebetween lies in the different peak intensities. More particularly, in the emitting spectrum of FIG. 3, the red light (with a wavelength of 614 nm) emitted by $Na_2Eu(WO_4)_{0.5}(MoO_4)_{0.5}(PO_4)$ in embodiment 2 has the highest intensity.

Embodiment 3

Similar to the embodiment 1, embodiment 3 discloses a manufacturing method as illustrated in FIG. 1. According to the manufacturing method of the present embodiment, a mixture is formed by mixing $Na_2MoO_4$, $Eu_2O_3$, and $(NH_4)_2HPO_4$ according to stoichiometry. After the mixture is ground and sintered, a red light fluorescent material $Na_2Eu(MoO_4)(PO_4)$ of the embodiment 3 is obtained. Similarly, the characteristics identification is performed on the red light fluorescent material of the embodiment 3, and the results are represented in FIGS. 2~5. The absorption of the red light fluorescent material $Na_2Eu(MoO_4)(PO_4)$ of the embodiment 3 is shown at x=1.

The spectrum properties of the red light fluorescent material in the embodiment 3 are similar to those of the red light fluorescent material in the embodiment 1 and thus are not repeated herein. The difference therebetween lies in the different peak intensities. From the results of the foregoing analysis, the red light fluorescent materials of the embodiments 1~3 in the present invention all achieve high absorption of light within the specific wavelength scope and have high emitting intensities at the red light region with the wavelength of 614 nm.

In light of the foregoing, the red light fluorescent material disclosed in the present invention provides a red light with high color purity, high luminance, and high color saturation. The embodiments 1~3 of the present invention are compared with the commercial red light fluorescent materials (comparison example 1 and comparison example 2) for further description. The red light fluorescent material disclosed in the embodiments 1~3 and the commercial red light fluorescent material in comparison examples are measured under the same condition with use of the measuring instrument described in the embodiment 1, and the results are presented in Table 1.

TABLE 1

| | Red light fluorescent material | Chromatic coordinates (x, y) | Relative luminance (a.u.) |
|---|---|---|---|
| Embodiment 1 | $Na_2Eu(WO_4)(PO_4)$ | (0.66, 0.33) | 1.5 (cd/m2) |
| Embodiment 2 | $Na_2Eu(WO_4)_{0.5}(MoO_4)_{0.5}(PO_4)$ | (0.66, 0.33) | 1.9 (cd/m2) |
| Embodiment 3 | $Na_2Eu(MoO_4)(PO_4)$ | (0.66, 0.33) | 1.6 (cd/m2) |
| Comparison example 1 | $Y_2O_2S:Eu^{3+}$ | (0.66, 0.33) | 1.0 (cd/m2) |
| Comparison example 2 | $La_2O_2S:Eu^{3+}$ | (0.67, 0.32) | 1.3 (cd/m2) |

Referring to Table 1, the embodiments 1~3 disclose the red light fluorescent material provided in the present invention. The comparison example 1 refers to the commercial red light fluorescent material Kasei Optonix P22-RE3 ($Y_2O_2S:Eu^{3+}$). The comparison example 2 refers to the commercial red light fluorescent material Kasei Optonix KX-681B ($La_2O_2S:Eu^{3+}$).

It is clear shown from Table 1 that the chromatic coordinates of the embodiments 1~3 are identical to those of the comparison example 1, all of which are (0.66, 0.33). In other words, the red lights obtained from the red light fluorescent materials described in the embodiments 1~3 have the same color purity as the commercial materials does. Moreover, the red lights approach pure red (0.67, 0.33), which is specified by the NTSC.

It should be noted that the relative luminance discussed in all of the embodiments 1~3 is larger than that discussed in the comparison examples 1~2. Especially in the embodiment 2, when the mole fraction of Mo to W is 0.5:0.5, the relative luminance is 1.9 (cd/m$^2$), which is the highest in Table 1. Through the comparison indicated in Table 1, the red light emitted by the red light fluorescent material of the present invention has high color purity and higher relative luminance than the relative luminance of the conventional commercial products.

White Light Luminescent Device

Figure 6:
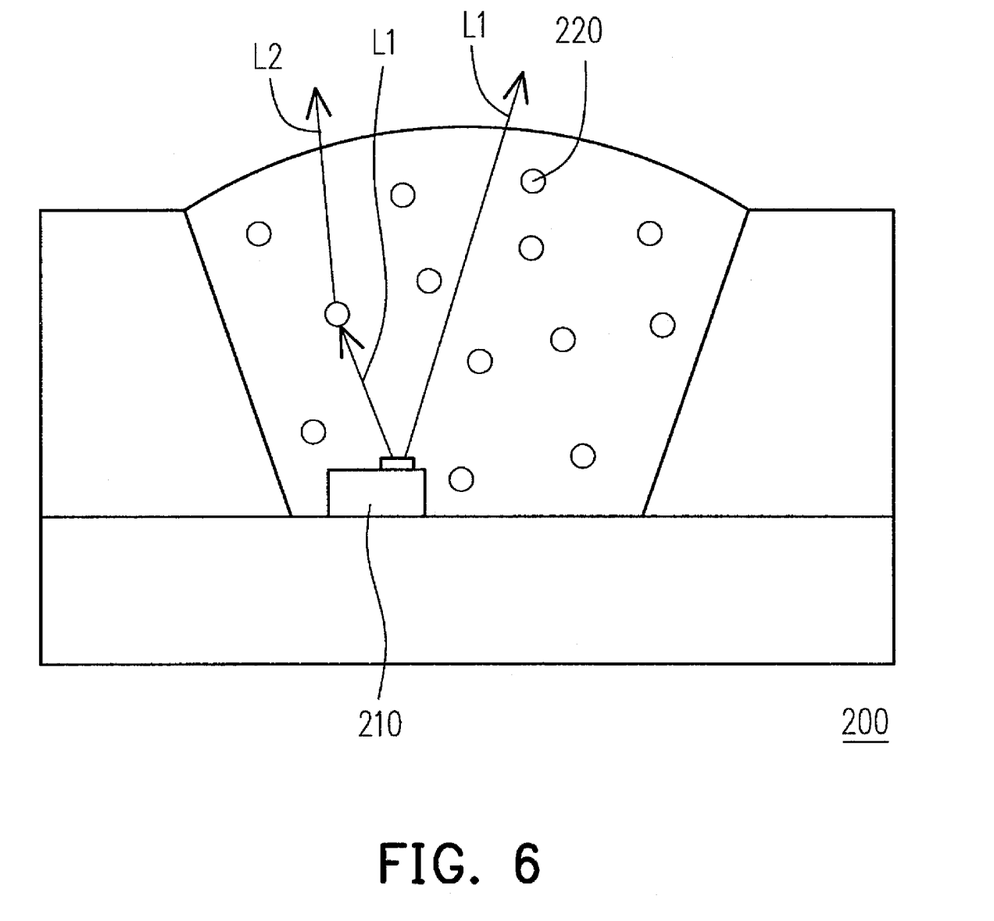
FIG. 6 is a schematic diagram of a white light luminescent device according to an embodiment of the present invention.

FIG. 6 is a schematic diagram of a white light luminescent device according to an embodiment of the present invention. Referring to FIG. 6, a white light luminescent device 200 includes an LED chip 210 and a phosphor material 220. The LED chip 210 emits a first light L1, and the phosphor material 220 includes at least the aforementioned red light fluorescent material. Here, the phosphor material 220 is excited by the first light L1 to emit a second light L2. The first light L1 and the second light L2 are mixed to generate a white light.

The wavelength of the first light L1 ranges from 360 nm to 550 nm. When the wavelength of the first light L1 includes the near UV light wavelength of 394±10 nm, the blue light wavelength of 465±10 nm, or the yellow-green light wavelength of 535±10 nm, the phosphor material 220 (including at least the above-mentioned red light fluorescent material) is excited so as to emit the second light L2.

In addition, the phosphor material 220 can further include a yellow light fluorescent material (not shown), a blue light fluorescent material (not shown), or a green light fluorescent material (not shown). The aforesaid red light fluorescent material is adapted to be optionally cooperated with the yellow light fluorescent material, the blue light fluorescent material, and the green light fluorescent material.

More specifically, in the white light luminescent device 200, the phosphor material 220 can be the red light fluorescent material provided in the present invention, a dual-fluorescent material system, or even a multiple-fluorescent material system. For example, when the phosphor material 220 is merely the red light fluorescent material provided in the present invention, the LED chip 210 can be the blue-green LED, for instance. At this time, the first light L1 (blue-green light) emitted by the LED chip 210 and the second light L2 (red light) emitted by the red light fluorescent material are mixed to generate a white light.

When the phosphor material 220 is the dual-fluorescent material system, the phosphor material 220 is, for example, the mixture of the red light fluorescent material of the present invention and another yellow light fluorescent material. Here, the LED chip 210 can be the blue LED to emit the first light L1 (blue light). The second light L2 is a mixture of the red light and the yellow light. After the first light L1 and the second light L2 are mixed, the white light is generated.

Besides, the phosphor material 220 can also be the mixture of the red light fluorescent material of the present invention, the green light fluorescent material, and the blue light fluorescent material. The LED chip 210 can be the UV LED. At this time, the first light L1 generated by the LED chip 210 is the UV light, and the second light L2 generated by the phosphor material 220 is the blue light, the green light, and the red light. The UV light, the blue light, the green light, and the red light are then mixed to generate the white light.

As described above, the white light luminescent device 200 can generate white light by adopting different fluorescent material systems or different LED combinations. The arrangement and the combination of the white light luminescent device 200 can be adjusted by those having ordinary skill in the art according to the purposes and considerations thereof.

In summary, the red light fluorescent material and the manufacturing method thereof, and the white light luminescent device provided in the present invention have at least the following advantages.

Since the red light fluorescent material has a unique crystal structure, the red light with high luminance and high color purity can be generated so as to improve the color rendering property of the white light. Additionally, as the red light fluorescent material of the present invention includes oxides, the red light fluorescent material has high chemical stability (moisture and thermally stable) in comparison with the sulfide-containing fluorescent powder. Moreover, the manufacturing method of the red light fluorescent material provided in the present invention requires a low sintering temperature, and the power consumption can be reduced as a consequence. Furthermore, the white light luminescent device provided in the present invention utilizes the red light fluorescent material. Hence, the lifetime and the application scope of the white light luminescent device are both extended.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A red light fluorescent material, adapted for being excited by a first light to emit a red light and having a characteristic of:
    comprising a chemical formula (1) presented below, $$A_2Eu(MO_4)(PO_4) \tag{1},$$

wherein A represents lithium (Li), sodium (Na), potassium (K), rubidium (Rb), cesium (Cs), or silver (Ag), and M represents molybdenum (Mo), tungsten (W), or a combination thereof ($Mo_xW_{(1-x)}$).

2. The red light fluorescent material as claimed in claim 1, wherein a wavelength of the first light ranges from 360 nm to 550 nm.

3. The red light fluorescent material as claimed in claim 1, wherein a wavelength of the first light comprises a near UV light wavelength of 394±10 nm, a blue light wavelength of 465±10 nm, or a yellow-green light wavelength of 535±10 nm.

4. The red light fluorescent material as claimed in claim 1, wherein a wavelength of the red light comprises 614 nm.

5. The red light fluorescent material as claimed in claim 1, wherein when M represents the combination of molybdenum and tungsten ($Mo_xW_{(1-x)}$), x is a mole fraction ranging from 0 to 1.

6. The red light fluorescent material as claimed in claim 1, wherein a pair of chromaticity coordinates of the red light are (0.66, 0.33).

7. The red light fluorescent material as claimed in claim 1, wherein a relative luminance value of the red light is 1.5~1.9 ($cd/m^2$).

8. A manufacturing method of a red light fluorescent material, comprising:
    based on a stoichiometry, providing a mixture comprising an europium oxide ($Eu_2O_3$), a diammonium hydrogen phosphate (($NH_4)_2HPO_4$), and a metal molybdate or a metal tungstate, or a combination of said metal molybdate and said tungstate, wherein the metal molybdate is silver molybdate or alkali molybdate, and the metal tungstate is silver tungstate or alkali tungstate;
    mixing and grinding the mixture; and
    sintering the mixture to obtain the red light fluorescent material.

9. The manufacturing method of the red light fluorescent material as claimed in claim 8, wherein a time of mixing and grinding the mixture is 30 minutes.

10. The manufacturing method of the red light fluorescent material as claimed in claim 8, wherein a temperature of sintering the mixture is 600° C.

11. The manufacturing method of the red light fluorescent material as claimed in claim 8, wherein a time of sintering the mixture is from 6 hours to 10 hours.

12. The manufacturing method of the red light fluorescent material as claimed in claim 8, wherein the red light fluorescent material comprises a chemical formula (1) listed below, $$A_2Eu(MO_4)(PO_4) \qquad \text{formula (1)},$$

wherein A represents lithium (Li), sodium (Na), potassium (K), rubidium (Rb), cesium (Cs), or silver (Ag), and M represents molybdenum (Mo), tungsten (W), or a combination of Mo and W ($Mo_xW_{(1-x)}$).

13. The manufacturing method of the red light fluorescent material as claimed in claim 8, further comprising a characteristics identification step in which physical and chemical properties of the red light fluorescent material are identified.

14. The manufacturing method of the red light fluorescent material as claimed in claim 13, wherein the characteristics identification step comprises:
performing an X-ray diffraction analysis, a fluorescence spectroscopy analysis, a chromaticity coordinate analysis, or a UV light-visible light reflection spectroscopy analysis.

15. A white light luminescent device, comprising:
a light emitting diode chip emitting a first light; and
a phosphor material comprising at least the red light fluorescent material as claimed in claim 1,
wherein the phosphor material is excited by the first light to emit a second light, and the first light and the second light are mixed to generate a white light.

16. The white light luminescent device as claimed in claim 15, wherein a wavelength of the first light ranges from 360 nm to 550 nm.

17. The white light luminescent device as claimed in claim 15, wherein a wavelength of the first light comprises a near UV light wavelength of 394±10 nm, a blue light wavelength of 465±10 nm, or a yellow-green light wavelength of 535±10 nm.

18. The white light luminescent device as claimed in claims 15, wherein the phosphor material further comprises:
a yellow light fluorescent material, a blue light fluorescent material, or a green light fluorescent material,
wherein the red light fluorescent material is adapted to be used in coordination with the yellow light fluorescent material, the blue light fluorescent material, and the green light fluorescent material optionally.

* * * * *